United States Patent [19]

Thompson

[11] Patent Number: 4,479,991

[45] Date of Patent: Oct. 30, 1984

[54] PLASTIC COATED LAMINATE

[75] Inventor: Fred E. Thompson, Quinton, Va.

[73] Assignee: AT&T Technologies, Inc., New York, N.Y.

[21] Appl. No.: 366,431

[22] Filed: Apr. 7, 1982

[51] Int. Cl.³ ............................................. B32B 3/24
[52] U.S. Cl. ..................................... 428/76; 428/137; 428/138; 428/901; 174/68.5; 361/397
[58] Field of Search ................. 428/901, 137, 138, 76; 174/68.5; 361/397

[56] References Cited

U.S. PATENT DOCUMENTS

| | | | |
|---|---|---|---|
| 3,296,099 | 1/1967 | Dinella | 204/15 |
| 3,614,225 | 10/1971 | Dinella | 355/85 |
| 3,622,384 | 11/1971 | Davey et al. | 174/68.5 X |
| 3,691,632 | 9/1972 | Smith | 174/68.5 X |
| 3,704,164 | 11/1972 | Travis | 428/901 X |
| 3,758,332 | 9/1973 | Dinella et al. | 428/901 X |
| 3,846,166 | 11/1974 | Saiki et al. | 174/68.5 X |
| 4,077,927 | 3/1978 | McPherson | 260/23.7 N |

OTHER PUBLICATIONS

*Western Electric Engineer*, vol. 9, No. 3, Jul. 1965, pp. 24–29.

*Primary Examiner*—Alexander S. Thomas
*Attorney, Agent, or Firm*—J. B. Hoofnagle

[57] ABSTRACT

An electrically nonconductive board (22) has thin layers (24, and 25) of metal bonded to major surfaces thereof to form a laminate substrate (20). Axially aligned relief holes (26), each having a side wall (27) are formed in each of the thin layers (24 and 25) of metal of the laminate substrate (20). The laminate substrate (20) and the relief holes (26) are then coated and encapsulated with a plastic resin (28) to form a plastic coated laminate (30).

11 Claims, 4 Drawing Figures

U.S. Patent  Oct. 30, 1984  4,479,991
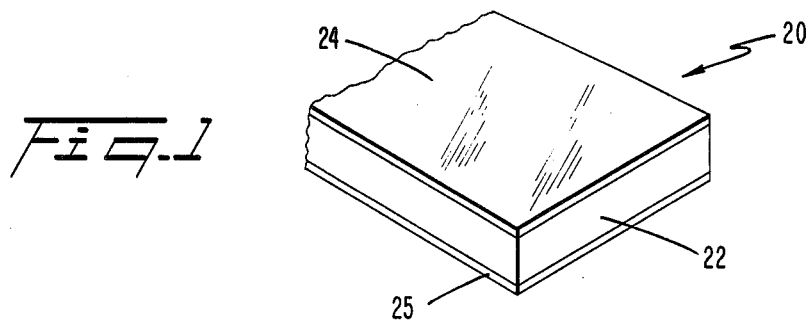
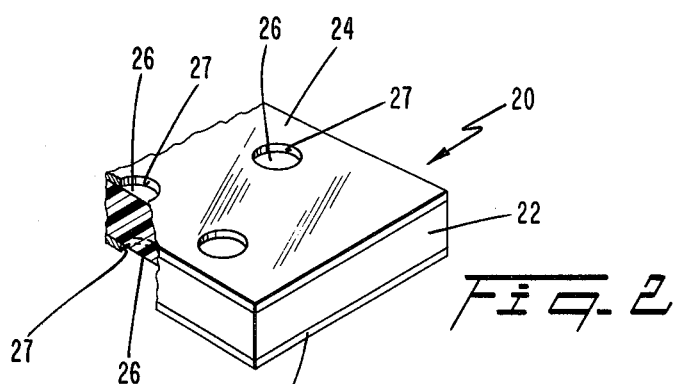
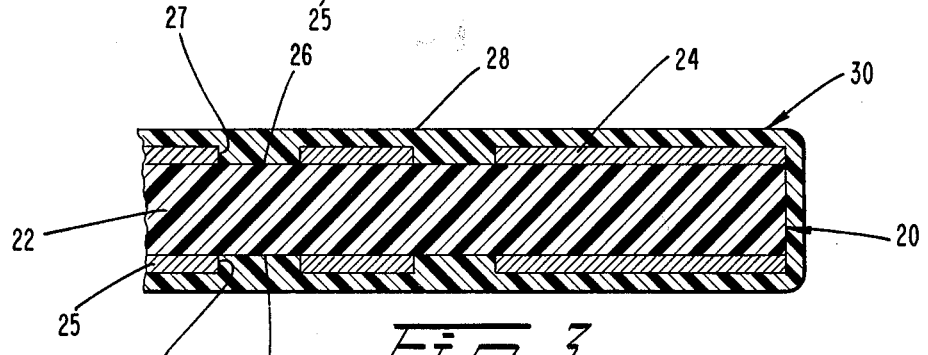
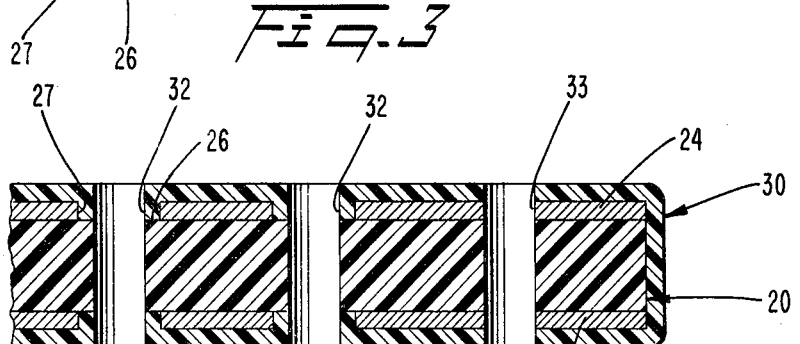

PLASTIC COATED LAMINATE

TECHNICAL FIELD

This invention relates to a plastic coated laminate having a nonconductive coating. Particularly, this invention relates to a laminate wherein the laminate contains a layer of metal on at least one major surface of an insulation panel all of which is encapsulated by an insulation coating.

BACKGROUND OF THE INVENTION

In the manufacture of some types of printed wiring boards, an insulation substrate, which may be rigid or flexible, is typically formed with copper cladding on one or both major surfaces thereof. Conventional techniques, such as imaging, plating, etching and drilling, are then employed to selectively form circuit patterns on the copper cladding. Circuit patterns of varying complexity and density may be formed in this manner. Typically, simple low density circuit patterns may be formed on substrates having copper only on one major surface by drilling, imaging and etching. Plating may also be employed for suitable finishing to enhance solderability or to add precious metal contact areas for interconnecting to other circuits. Complex circuits may be formed on the substrate having copper on both major surfaces using a substractive process. Typically, holes, which are formed in the substrate by drilling, punching or a laser, are subsequently plated to interconnect conductive circuit patterns on one major surface of the substrate to circuit patterns formed on the opposite major surface of the substrate. If a higher density of circuits is required, patterned substrates may be stacked and laminated together to form multilayered printed circuits. As noted above, circuit patterns on the various layers are interconnected with plated-through holes, which are typically formed along with surface layer circuit patterns or pads after the lamination operation.

In either type of manufacture of printed circuits, the base for the printed circuit is the substrate. In some instances, the substrate is formed by woven or random matted fibers, such as glass or polyester, which are impregnated in a suitable resin to impart physical and electrical properties to the substrate. The substrate may be comprised of single or multiple layers of reinforcement depending on the desired thickness and physical properties. In other instances, the substrate is composed of a special material, or specially treated material, which permits the direct circuit-pattern application of copper to the substrate. A system of this type is disclosed in U.S. Pat. No. 4,077,927 which issued to C. A. McPherson on Mar. 7, 1978.

In still another type of substrate, a metal panel is coated with an epoxy resin following the formation of a suitable hole pattern. Copper is selectively plated onto the epoxy resin surface and through the holes by additive techniques to form the desired circuit pattern. A metal panel substrate of this type, and the technique for making the substrate is disclosed in an article entitled "An Insulated Metal Printed Wire Board" authored by Donald Dinella and appears at pages 24 through 29 in the *Western Electric Engineer,* Volume 9, No. 3, dated July 1965. Typically, the metal panel is composed of a steel alloy which provides an electrostatic and magnetic shield. Further, the presence of the metal panel provides heat dissipation for components subsequently secured to the panel and connected to circuits formed thereon.

Although the metal panel substrate possesses the properties of strength, heat dissipation and shielding, there are instances when it would be desirable to use a metal coated non-metallic substrate having the same properties as the resin-coated metal panel but which is manufactured by use of conventional techniques.

Consequently, there is a need for a substrate or laminate having the advantages of strength, shielding and heat dissipation which is manufactured utilizing existing conventional printed wiring board technology which will provide for high density printed wiring and maximum economies of manufacture.

SUMMARY OF THE INVENTION

This invention relates to a plastic coated laminate having a nonconductive coating and methods of making the laminate. A layer of metal is bonded to at least one major surface of an electrically nonconductive board to form a laminate substrate. At least one relief hole is formed in the layer of metal of the laminate substrate. The laminate substrate is then coated and encapsulated with a plastic resin in order to form the plastic coated laminate.

BRIEF DESCRIPTION OF THE DRAWINGS

FIG. 1 is a perspective view showing a laminate substrate formed by a nonconductive board with a thin layer of metal bonded to major surfaces of the board;

FIG. 2 is a view showing a plurality of relief holes formed in the layers of metal of the laminate substrate of FIG. 1;

FIG. 3 is a sectional view showing a plastic coated laminate embodying certain principles of the invention; and FIG. 4 is a sectional view showing the formation of through holes through the plastic coated laminate of FIG. 3 and embodying certain principles of the invention.

DETAILED DESCRIPTION

Referring to FIG. 1, a laminate substrate, designated generally by the numeral 20, includes an insulation panel 22, such as an electrically nonconductive epoxy-glass board, having thin layers 24 and 25 of copper bonded to both major surfaces thereof. Using conventional copper-removal techniques, a plurality of relief holes 26 having side walls 27 are etched in each of the layers 24 and 25 of copper as illustrated in FIG. 2 with respect to layer 24. As illustrated in FIG. 3, the entire substrate 20 is then coated and encapsulated with a plastic resin 28, such as an epoxy resin, using conventional techniques to form a plastic coated laminate, designated generally by the number 30. It is particularly noted that the plastic resin 28 is deposited in and fills the relief holes 26. As illustrated in FIG. 3, the plastic resin 28 forms a relatively smooth base, including the areas adjacent to the holes 26. The smooth base forms planar exterior surfaces on opposite sides of the laminate 30 which are parallel to the major surfaces of the insulation panel 22 and upon which printed circuits may be formed subsequently. Moreover, the plastic resin 28 insulates the thin layers 24 and 25 of copper from the printed circuits which may be formed subsequently thereon.

As illustrated in FIG. 4, through holes 32, each having a diameter which is smaller than the relief holes 26, are drilled through the plastic coated laminate 30. Through holes 32 are drilled centrally in the locations of the relief holes 26. Due to the relatively small diameters of the through holes 32 and the covering of the side walls 27 of the relief holes 26 by the plastic resin 28, the through holes do not pass through the thin layers 24 and 25 of copper. The plastic coated laminate 30 can be processed thereafter in a conventional manner to form printed circuits (not shown) on the plastic resin 28. The through holes 32 also may be plated to form plated-through holes (not shown) when the laminate 30 is processed in the conventional manner to manufacture printed circuits. Thus, by drilling the through holes 32 having the smaller diameter through the laminate 30 and centrally through the plastic encapsulated relief holes 26, the subsequently plated-through holes are physically and electrically insulated from the thin layers of copper 24 and 25.

In addition, through holes 33 may be drilled through the plastic coated laminate 30 at locations spaced from the relief holes 26 to facilitate the establishment of direct electrical contact between the thin layers 24 and 25 of copper and the printed circuits (not shown) subsequently formed on the plastic resin 28. Through holes 33 may be plated subsequently to form plated-through holes (not shown) in the same manner described above for through holes 32.

Since the plastic resin 28 forms a smooth, planar exterior surface where each of the through holes 32 and 33 are to be formed, the areas of the surface surrounding each of the holes is planar with the remaining areas of the surface to thereby enhance the surface topography of the laminate 30. The enhanced topography of the laminate 30 increases the capability to subsequently image a higher density of fine line circuitry particularly between the through holes 32 and 33.

The thin layers 24 and 25 of copper provide (1) electrostatic shielding, (2) improved dimensional stability during processing and (3) enhanced heat distribution capability of the ultimate printed circuit board (not shown).

As an alternate embodiment, a thin layer of steel (not shown) can be used in place of each of the layers 24 and 25 of copper to provide magnetic as well as electrostatic shielding. Also, a voltage can be applied to the thin layers 24 and 25 of copper or steel to produce a biased ground plane. Moreover, instead of using the layers 24 and 25 of copper for shielding, the layers of copper can be patterned to provide power and ground to the printed circuits to be formed subsequently on the laminate 30. The voltage is applied to the layers 24 and 25 of copper and is carried to the subsequently formed printed circuits via the plated-through holes 33.

The preferred embodiment of the invention, as described hereinabove, is to provide the plastic coated laminate 30 having thin layers 24 and 25 of copper bonded to major surfaces of the substrate 20. The plurality of relief holes 26 are formed in each of the layers 24 and 25 of copper. The substrate 20, formed with relief holes 26, is then coated and encapsulated with the plastic resin 28 to produce the plastic coated laminate 30.

In another embodiment, a plastic coated laminate is formed to have an outward appearance which is identical to laminate 30. However, the laminate is formed with only a single layer of copper, for example, such as layer 24, on one major surface of an insulation panel with the layer being formed with relief holes in the same manner as relief holes 26. Such a single-layered laminate could be used in the same manner as laminate 30.

What is claimed is:

1. A plastic coated laminate which comprises:
   an electrically nonconductive board;
   an integrally formed layer of metal bonded to and covering substantially one major surface of the board to produce a laminate substrate;
   at least one relief hole formed through only the layer of metal with a solid surface portion of the one major surface exposed by the relief hole to form an imperforate base surface for the relief hole; and
   a layer of plastic resin which encapsulates the laminate substrate, including the integrally formed layer of metal which covers substantially the one major surface of the board, and which is located in the relief hole and on the imperforate base surface to form a plastic coated laminate.

2. The plastic coated laminate as recited in claim 1 further comprises at least one through hole formed through the plastic coated laminate.

3. The plastic coated laminate as recited in claim 2 wherein the relief hole formed through the metal layer includes a metal side wall and wherein the through hole has a diameter which is smaller than the diameter of the relief hole and which is formed through the laminate at the location of the relief hole and is spaced from the metal side wall of the relief hole.

4. The plastic coated laminate as recited in claim 3 wherein the plastic resin, which is located in the relief hole, insulates the through hole from the metal side wall of the relief hole.

5. The plastic coated laminate as recited in claim 4 which further comprises at least one through hole formed through the laminate at a location other than the location of the relief hole.

6. The plastic coated laminate as recited in claim 1 wherein the integrally formed layer of metal is a first layer and the one major surface is a first major surface on one side of the board and which further comprises:
   a second integrally formed layer of metal bonded to and covering substantially a second major surface on an opposite side of the board;
   at least one relief hole formed through only the second layer of metal with a solid surface portion of the second major surface of the board exposed by the relief hole to form an imperforate base surface for the relief hole and where the relief hole formed through the second layer is aligned axially with the relief hole formed through the first layer of metal and spaced therefrom by the thickness of the board; and
   the layer of plastic resin also encapsulates the second layer of metal and also is located in the relief hole formed through the second layer of metal and on the imperforate base surface formed by the solid surface portion of the second major surface of the board.

7. The plastic coated laminate as recited in claim 6 which further comprises at least one through hole formed through the plastic coated laminate.

8. The plastic coated laminate as recited in claim 7 wherein each of the axially aligned relief holes formed in the metal layers includes a metal side wall and wherein the through hole has a diameter which is smaller than the diameter of each of the axially aligned relief holes and which is formed through the laminate at the location of the aligned relief holes and is spaced from the metal side walls of the relief holes.

9. The plastic coated laminate as recited in claim 8 wherein the plastic resin, which is located in the relief hole formed through the second layer of metal insulates the through hole from the metal side wall of the second layer relief hole.

10. The plastic coated laminate as recited in claim 1 wherein the metal is copper.

11. The plastic coated laminate as recited in claim 1 wherein the metal is steel.

* * * * *